(12) United States Patent
MacDonald

(10) Patent No.: US 6,700,516 B1
(45) Date of Patent: Mar. 2, 2004

(54) MIXER-BASED TIMEBASE FOR SIGNAL SAMPLING

(75) Inventor: Willard MacDonald, Bolinas, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/374,259

(22) Filed: Feb. 25, 2003

(51) Int. Cl.⁷ .................................................. H03M 1/00
(52) U.S. Cl. .................... 341/122; 341/120; 324/76.19; 324/76.23; 324/76.24
(58) Field of Search ................................. 341/120, 122; 324/76.15, 76.16, 76.19, 76.22, 76.23, 76.24

(56) References Cited

U.S. PATENT DOCUMENTS

| 4,495,586 | A | | 1/1985 | Andrews |
| 4,578,667 | A | | 3/1986 | Hollister |
| 4,678,345 | A | | 7/1987 | Agoston |
| 4,694,244 | A | * | 9/1987 | Whiteside et al. ...... 324/121 R |
| 4,719,416 | A | | 1/1988 | Desautels |
| 4,884,020 | A | | 11/1989 | Blakeslee |
| 4,928,251 | A | | 5/1990 | Marzalek et al. |
| 5,260,670 | A | * | 11/1993 | Ainsworth et al. ........... 327/94 |
| 5,315,627 | A | | 5/1994 | Draving |
| 6,573,761 | B1 | * | 6/2003 | MacDonald et al. .......... 327/91 |

* cited by examiner

Primary Examiner—Michael Tokar
Assistant Examiner—Khai Nguyen

(57) ABSTRACT

Signal sampling is performed. A sampler takes samples of a sampled signal. A first analog-to-digital (A/D) converter receives the samples from the sampler. A clock reference is synchronous with the sampled signal. A phase comparator produces a difference value that indicates a phase difference between the clock reference and an oscillating signal. A second A/D converter receives the difference value. The oscillating signal is used in controlling when the sampler takes samples of the sampled signal.

22 Claims, 5 Drawing Sheets

MIXER-BASED TIMEBASE FOR SIGNAL SAMPLING

BACKGROUND

The present invention concerns sampling methods used within electronic instruments such as oscilloscopes and pertains particularly to mixer-based timebase for signal sampling.

Eye diagram analysis is an important tool for studying the behavior of high-speed digital electrical and optical communications signals. An eye diagram is a way of displaying on an oscilloscope the waveform shapes of all logic one-zero combinations. It is generated by applying a data waveform to the vertical channel of an oscilloscope while triggering from a synchronous clock signal.

Currently, at data rates below about 3 gigabits per second (Gb/s), real-time sampling oscilloscopes are commonly used. A real-time sampling oscilloscope employs a very high speed analog-to-digital (A/D) converter to capture a waveform record consisting of a complete sequence of successive data bits. The advantage of real-time sampling is that it allows visualization of the exact characteristics of a data pattern that precedes a waveform error such as slow risetime or excessive overshoot.

The A/D converter in a real time sampling oscilloscope must sample the waveform much faster than the data rate. Shannon's sampling theorem states that to unambiguously reconstruct a sine wave the sample rate must be at least twice the signal frequency. In reality, since digital data signals are not simple sine waves, an even higher sampling rate must be used. Most commercial real-time sampling oscilloscopes employ sampling rates of 4–10 times the data rate.

Currently, the fastest commercial real-time sampling oscilloscopes on the market today are limited to about 6 gigahertz (GHz) bandwidth and 20 gigasamples (GSamp/s) sample rates. This bandwidth is useful only for data rates up to about 2.5 gigabits (Gb/s). For higher data rates, equivalent-time sampling technology is used.

One type of architecture used in an equivalent-time sampling system utilizes sequential timebase circuitry that detects a synchronous trigger event (such as a rising or falling edge in the applied trigger signal) and generates a precision programmable delay between the trigger event and the sample strobe. The precision delay generator is typically divided into a course and fine delay generator. Samples are taken at varying times determined by the timebase delay. Each trigger event causes the oscilloscope to take a single sample of the data waveform and display the sample as a single point on the screen. Each subsequent sample point (following a new trigger event) is increasingly delayed relative to the time of the trigger. After numerous trigger events, the oscilloscope fills the display with a sampled representation of the data pattern.

Another type of architecture used in an equivalent-time sampling system utilizes pseudo-random sampling. In pseudo-random sampling systems, the timing of the samples is typically not related to the repetitive signal input. The position of each sample on the time axis of the oscilloscope display is obtained by measuring the timing of each sample relative to an applied reference signal. See, for example U.S. Pat. No. 4,884,020 where a sinusoidal reference is sampled in quadrature to precisely determine the timing of the samples. For additional background information on random electrical sampling, see, for example, U.S. Pat. No. 5,315,627, U.S. Pat. No. 4,928,251, U.S. Pat. No. 4,719,416, U.S. Pat. No. 4,578,667 and U.S. Pat. No. 4,495,586.

The components used in timebase circuitry in existing sampling systems are quite complex and expensive. It is desirable, therefore, to more economically implement timebase circuitry.

SUMMARY OF THE INVENTION

In accordance with the preferred embodiment of the present invention, signal sampling is performed. A sampler takes samples of a sampled signal. A first analog-to-digital (A/D) converter receives the samples from the sampler. A clock reference is synchronous with the sampled signal. A phase comparator produces a difference value that indicates a phase difference between the clock reference and an oscillating signal. A second A/D converter receives the difference value. The oscillating signal is used in controlling when the sampler takes samples of the sampled signal.

DESCRIPTION OF THE PREFERRED EMBODIMENT

Figure 1:
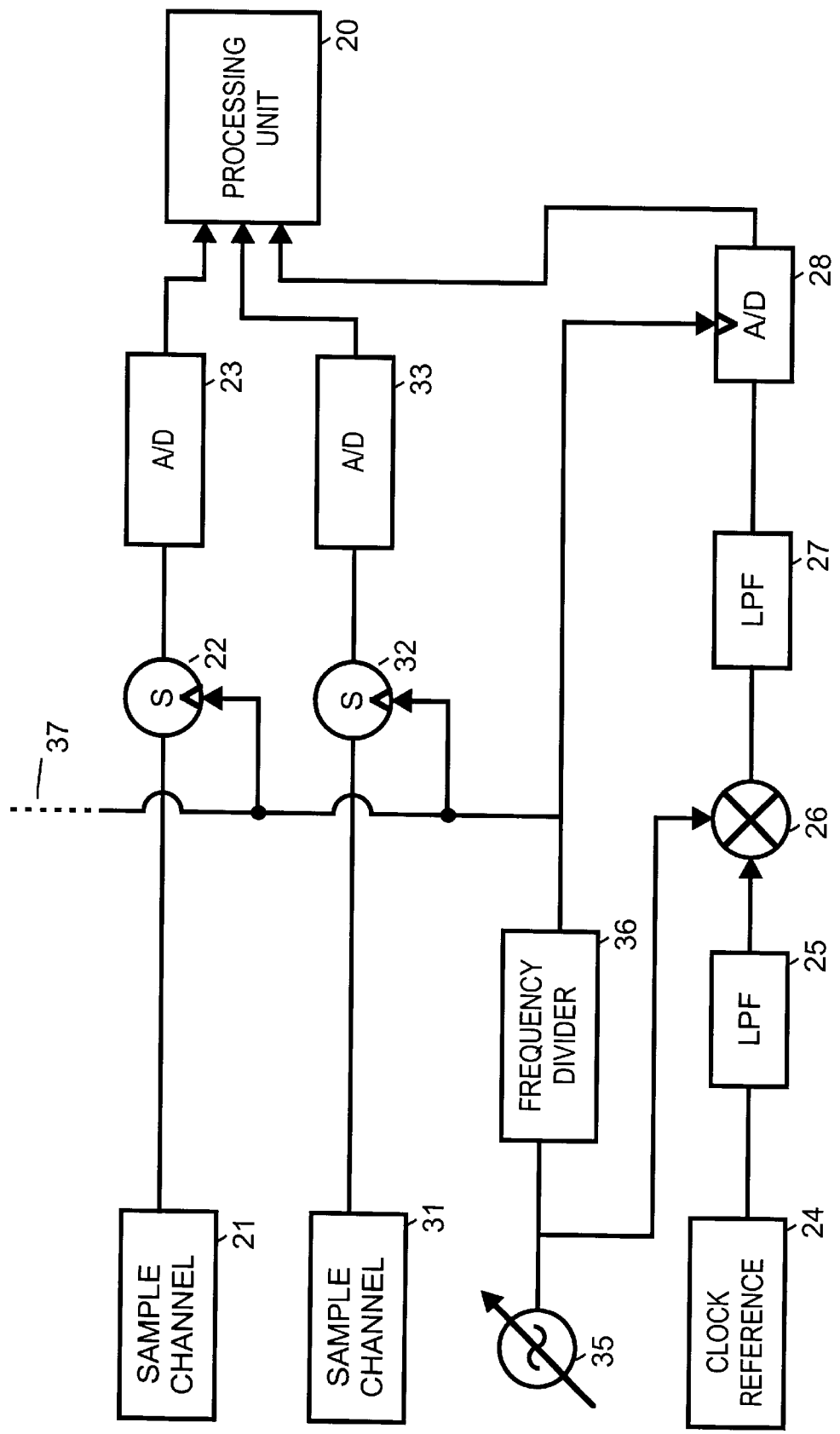
FIG. 1 is a simplified block diagram of sampling circuitry within an electronic device in accordance with a preferred embodiment of the present invention.

FIG. 1 is a simplified block diagram that shows sampling circuitry within an electronic device, such as an oscilloscope. A sampler (S) 22 samples a sample channel signal 21. An A/D converter 23 generates a digital value representing the analog voltage of the sample channel signal 21 at each sampling time. These digital values are stored for use in signal display and analysis. For example, sampler 22 is implemented by a fast switch and a storage component. In some embodiments, Sampler 22 also can include a step recover diode (SRD) to generate a short sample aperture. A/D converter 23 includes for example, amplification and filtering capability to accurately capture and convert the signals.

A sampler (S) 32 samples a sample channel signal 31. An A/D converter 33 generates a digital value representing the analog voltage of the sample channel signal 31 at each sampling time. These digital values are stored for use in signal display and analysis.

A sampling oscillator 35 generates a high frequency signal that is frequency divided by a frequency divider 36 in order to produce a sampling signal used to control timing of samples by sampler 22, sampler 32 and an A/D converter 28. The high frequency signal is asynchronous to sample channel signal 21 and is asynchronous to sample channel signal 31. For example, frequency divider 36 is implemented by a phase locked loop, a counter or some other circuitry that accomplishes division of signal frequency.

A processing unit 20 receives data from A/D converter 23, A/D converter 28 and A/D converter 31 and uses the data to perform digital display and analysis.

While FIG. 1 shows only sample channel signal 21 and sample channel signal 31, as represented by a line 37, frequency divider 36 can supply the sampling signal to additional samplers facilitating the sampling of additional sample channel signals. Embodiments of the present invention also can be implemented with only a single sample channel.

A clock reference 24 is synchronous with sample channel signal 21 and sample channel signal 31. A low pass filter (LPF) 25 is used to remove any noise and/or harmonics within clock reference 24. Low pass filter 25 can be implemented in hardware. Alternatively, the function of low pass filter 25 can be implemented in the software used to process information gathered about clock reference 24. Provided clock reference 24 is a sufficiently clean sinusoid, low pass filter 25 may be omitted.

A radio frequency (RF) mixer 26 performs a mix operation between the high frequency signal generated by sampling oscillator 35 and clock reference 24 producing an intermediate frequency (IF) that is the sum and difference of frequencies input to mixer 26. A low pass filter (LPF) 27 removes the sum component of the mixed signal, leaving the difference component of the mixed signal. The difference component of the mixed signal indicates the frequency difference between clock reference 24 and the high frequency signal generated by sampling oscillator 35. Mixer 26 and LPF 27 together function as a phase comparator. While in the frequency domain, the output of the phase comparator is the frequency difference between clock reference 24 and the high frequency signal generated by sampling oscillator 35, in the time domain, the output of the phase comparator is the instantaneous phase difference between clock reference 24 and the high frequency signal generated by sampling oscillator 35.

A/D converter 28 generates digital values indicating the phase difference at each time the sample channels are sampled. When the frequency difference between clock reference 24 and the high frequency signal generated by sampling oscillator 35 is small, the difference component of the mixed signal will be low frequency (e.g., less than 20 kilohertz), allowing A/D converter 28 and any other following processing circuitry to operate at low frequency. Low frequency operation allows for a significant cost savings in components. When A/D converter 28 is band limited, then filtering within the phase comparator may not be necessary. In this case, LPF 27 is not necessary and the phase comparator can be implemented using mixer 26 alone. For example, A/D converter 28 includes a low frequency sample and hold capability. Provided the sampler 22, sampler 32 and A/D converter 28 are able to operate within the frequency range of sampling oscillator 35, frequency divider 36 can be omitted.

The high frequency signal generated by sampling oscillator 35 is set to match the nominal data rate around which sample channel signals 21 and 31 are centered. For example, the nominal data rate is 9.95324 Gb/s as defined by the Synchronous Optical Network (SONET) standard rate optical carrier (OC)-192. Any small drift in frequency between clock reference 24 and the high frequency signal generated by sampling oscillator 35 is detected and compensated for based on the digital values generated by A/D converter 28.

The frequency of the high frequency signal generated by sampling oscillator 35 must be kept close to the frequency of clock reference 24. For example, this can be achieved by keeping the difference in frequency between clock reference 24 and the high frequency signal generated by sampling oscillator 35 at an intermediate frequency, for example, less than 20 kilohertz (kHz). This can be accomplished by monitoring in software the difference in frequency between clock reference 24 and the high frequency signal generated by sampling oscillator 35 as detected by mixer 26 and accordingly adjusting the frequency at which sampling oscillator 35 operates. It may be necessary to detect an aliasing condition and search for the correct frequency. It is also necessary that sampling oscillator 35 not be exactly at the same frequency as clock reference 24, otherwise pseudo random sampling will not be achieved. This condition can also be detected in software and the frequency of sampling oscillator 35 can be adjusted accordingly.

Figure 2:
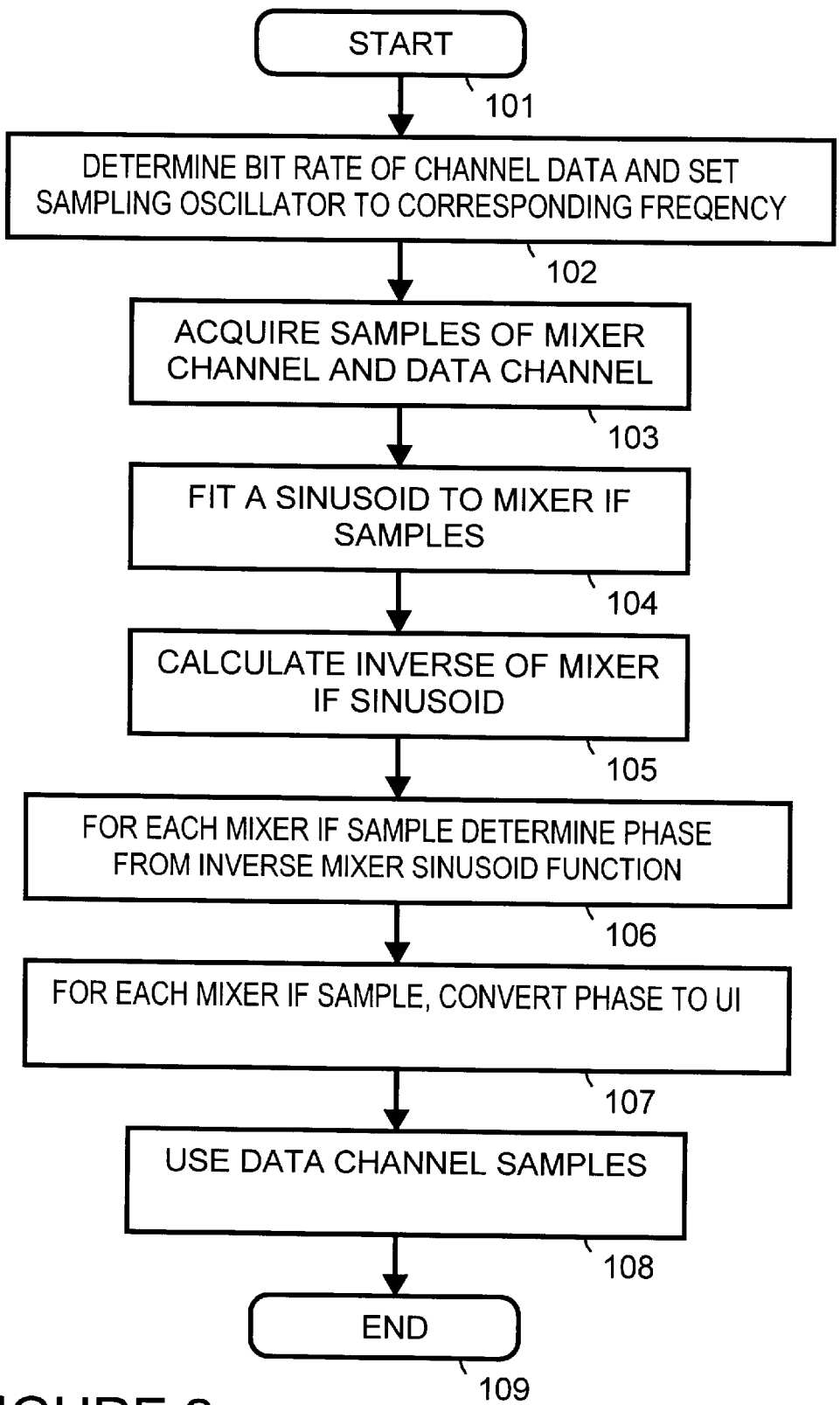
FIG. 2 is a flowchart that describes determination of timing data from information obtained by the sampling circuitry shown in FIG. 1 in accordance with a preferred embodiment of the present invention.

FIG. 2 is a flowchart that describes determination of timing data from information obtained and stored by A/D converter 23, A/D converter 33 and A/D converter 28. The process starts in a block 101.

In a block 102, the nominal data rate (also called the bit rate) of the sample channel is determined and sampling oscillator 35 is set to the corresponding frequency. For example, a user indicates the nominal data rate or it is derived from an incoming signal. For example, the user indicates the nominal data rate is 9.95324 Gb/s as defined by the SONET OC-192 standard. Alternatively, for example, for sample channel signal 21 and sample channel signal 31, the nominal data rate (i.e., the bit rate) can be derived from clock reference 24.

In a block 103, samples of the mixer channel are taken simultaneously with samples of the data channels. For example, A/D converter 23 captures sampled data channel voltage values of $S_K$ (where K ranges from 0 to N). Simultaneously A/D converter 28 captures mixer channel voltage values of $a_K$ (where K ranges from 0 to N).

In a block 104, a sinusoid waveform is fitted to the mixer channel voltage values ($a_0, a_1, a_2, \ldots a_N$). For example, the sinusoidal waveform (IF(t)) has a form as set out in Equation 1 below, where A represents amplitude, $\omega$ represents frequency and t represents time.

$$IF(t)=A*\cos(\omega *t) \qquad \text{Equation 1}$$

Where amplitude and/or frequency of clock reference 24 changes over time, using a narrow time window of data to calculate the form of the sinusoidal waveform (IF(t)) allows detection of and correction for the change. Thus adjusting the time window can improve accuracy.

In a block 105, an inverse of the sinusoidal waveform is calculated. For each sampled mixer channel voltage value ($a_k$) that occurs in the fitted sinusoidal waveform between 0 and $\pi$, the inverse ($I_K$) is calculated using Equation 2 below:

$$I_K=\arccos{(a_k/A)} \qquad \text{Equation 2}$$

For each sampled mixer channel voltage value ($S_k$) that occurs in the fitted sinusoidal waveform between $\pi$ and $2\pi$, the inverse ($I_K$) is calculated using Equation 3 below:

$$I_K=2\pi-\arccos{(a_k/A)} \qquad \text{Equation 3}$$

In a block 106, for each of the mixer channel voltage values ($a_0, a_1, a_2, \ldots a_N$), a phase is determined from the inverse of the sinusoidal waveform, calculated in block 105.

In a block 107, for each of the mixer channel voltage values ($a_0, a_1, a_2, \ldots a_N$), the phase calculated in block 106 is converted to a bit period unit interval (UI). For example, this is accomplished using Equation 4 below.

$$UI(a_k)=I_k/(2*\pi)$$  Equation 4

In a block 108, the data samples are used to represent the sampled data.

The sampled data may be displayed. For example, when displaying each data sample, the vertical component is determined by the sampled data channel voltage values of $S_K$ and the horizontal component is determined by the bit period interval $UI(a_k)$.

Alternatively, the horizontal component may be represented in seconds instead of unit intervals by dividing the unit intervals calculated in Equation 4 by the bit rate (determined in block 102) to convert unit intervals to seconds.

The sampled data also can be used for additional measurements and/or manipulations to provide further information about the sample channel signal.

In a block 109, the process is completed.

For the sampling circuitry shown in FIG. 1, sampler 22 and sampler 32 operate at a sampling frequency, for example, of approximately 40 kilohertz (kHz). In such a system, the frequency of the signal received by A/D converter 28 needs to be 20 kHz or less in order to provide adequate resolution of the signal captured by A/D converter 28.

In an alternative embodiment of the present invention, the frequency of the signal received by the mixer A/D converter can be sampled faster than and/or asynchronous to the sampling that occurs at the data channel. This is illustrated by the embodiment shown in FIG. 3.

Figure 3:
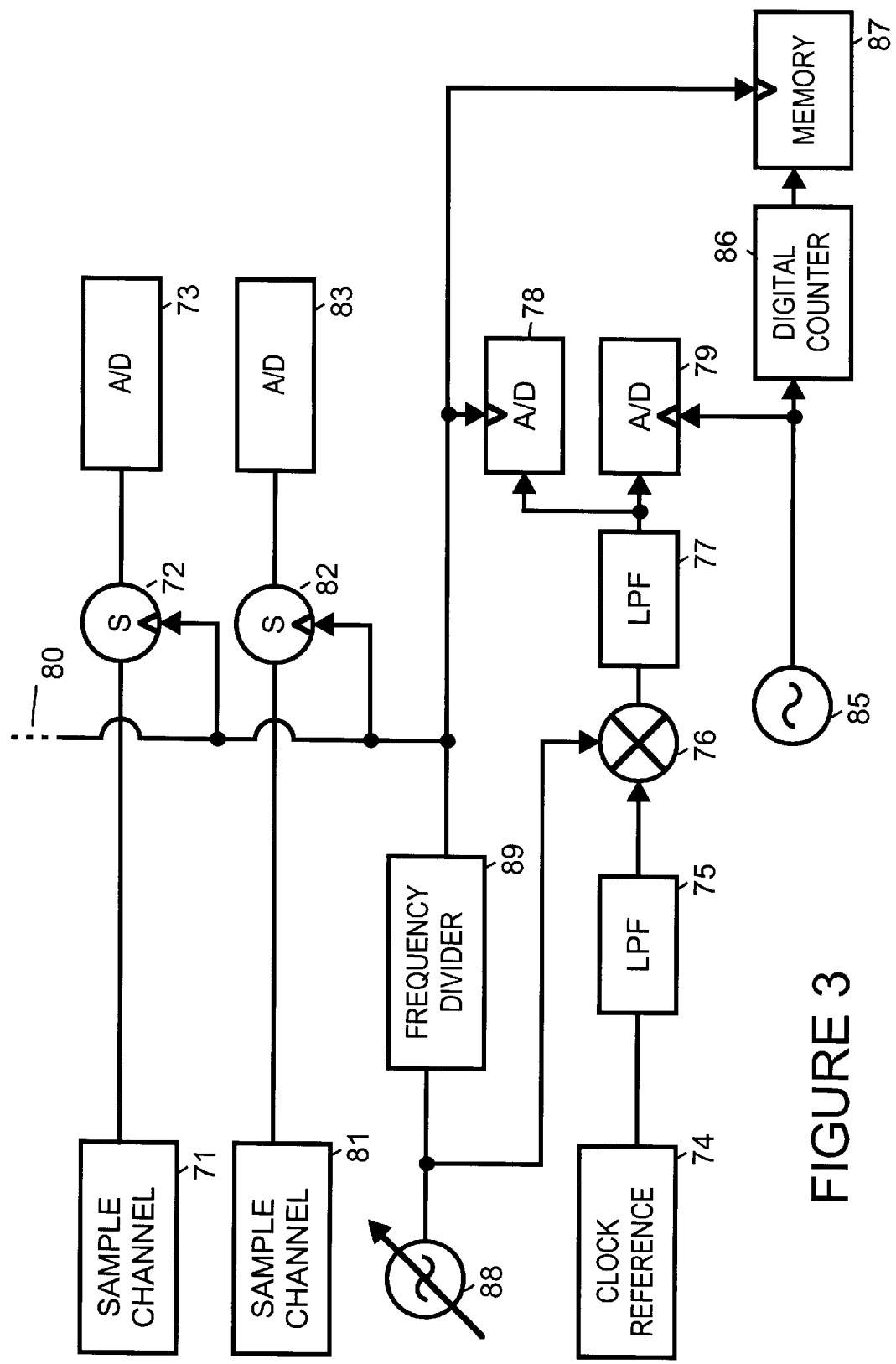
FIG. 3 is a simplified block diagram of sampling circuitry within an electronic device in accordance with an alternative preferred embodiment of the present invention.

FIG. 3 is a simplified block diagram that shows sampling circuitry within an electronic device, such as an oscilloscope. A sampler (S) 72 samples a sample channel signal 71. An A/D converter 73 generates a digital value representing the analog voltage of the sample channel signal 71 at each sampling time. These digital values are stored for use in signal display and analysis. In some embodiments, sampler 72 also can include a step recover diode (SRD) to generate a short sample aperture. A/D converter 73 includes for example, amplification and filtering capability to accurately capture and convert the signals.

A sampler (S) 82, samples a sample channel signal 81. An A/D converter 83 generates a digital value representing the analog voltage of the sample channel signal 81 at each sampling time. These digital values are stored for use in signal display and analysis.

A sampling oscillator 88 generates a high frequency signal that is frequency divided by a frequency divider 89 in order to produce a sampling signal used to control timing of samples by sampler 72, sampler 82, an A/D converter 78 and a memory 87. For example, frequency divider 89 is implemented by a phase locked loop, a counter or some other circuitry that accomplishes division of signal frequency. Provided the sampler 72, sampler 82, memory 87 and A/D converter 78 are able to operate within the frequency range of sampling oscillator 88, frequency divider 89 can be omitted.

While FIG. 3 shows only sample channel signal 71 and sample channel signal 81, as represented by a line 80, frequency divider 89 can supply the sampling signal to additional samplers facilitating the sampling of additional sample channel signals. Embodiments of the present invention also can be implemented with only a single sample channel.

A clock reference 74 is synchronous with sample channel signal 71 and sample channel signal 81. A low pass filter (LPF) 75 is used to remove any noise and/or harmonics within clock reference 74. Low pass filter 75 can be implemented in hardware. Alternatively, the function of low pass filter 75 can be implemented in the software used to process information gathered about clock reference 74. Provided clock reference 74 is a sufficiently clean sinusoid, low pass filter 75 may be omitted.

An RF mixer 76 performs a mix operation between the high frequency signal generated by sampling oscillator 88 and clock reference 74 producing an intermediate frequency (IF) that is the sum and difference of frequencies input to mixer 76. A low pass filter (LPF) 77 removes the sum component of the mixed signal, leaving the difference component of the mixed signal. The difference component of the mixed signal indicates the frequency difference between clock reference 74 and the high frequency signal generated by sampling oscillator 88. A/D converter 78 generates digital values indicating the frequency difference. Mixer 76 and LPF 77 together function as a phase comparator. While in the frequency domain, the output of the phase comparator is the frequency difference between clock reference 44 and the high frequency signal generated by sampling oscillator 88, in the time domain, the output of the phase comparator is the instantaneous phase difference between clock reference 74 and the high frequency signal generated by sampling oscillator 88.

The addition of an oscillator 85 and an A/D converter 79 allows for faster sampling of the difference component of the mixed signal. For example, oscillator 85 oscillates at a 100 megahertz (MHz), allowing 100 MHz sampling of the difference component of the mixed signal. This allows operation where the difference between the nominal data rate and the operating frequency of sampling oscillator 88 is up to 50 MHz.

Oscillator 85 is also used to drive a digital counter 86. Memory 87 records a current value of digital counter 86 when latched by the signal from frequency divider 89.

Figure 4:
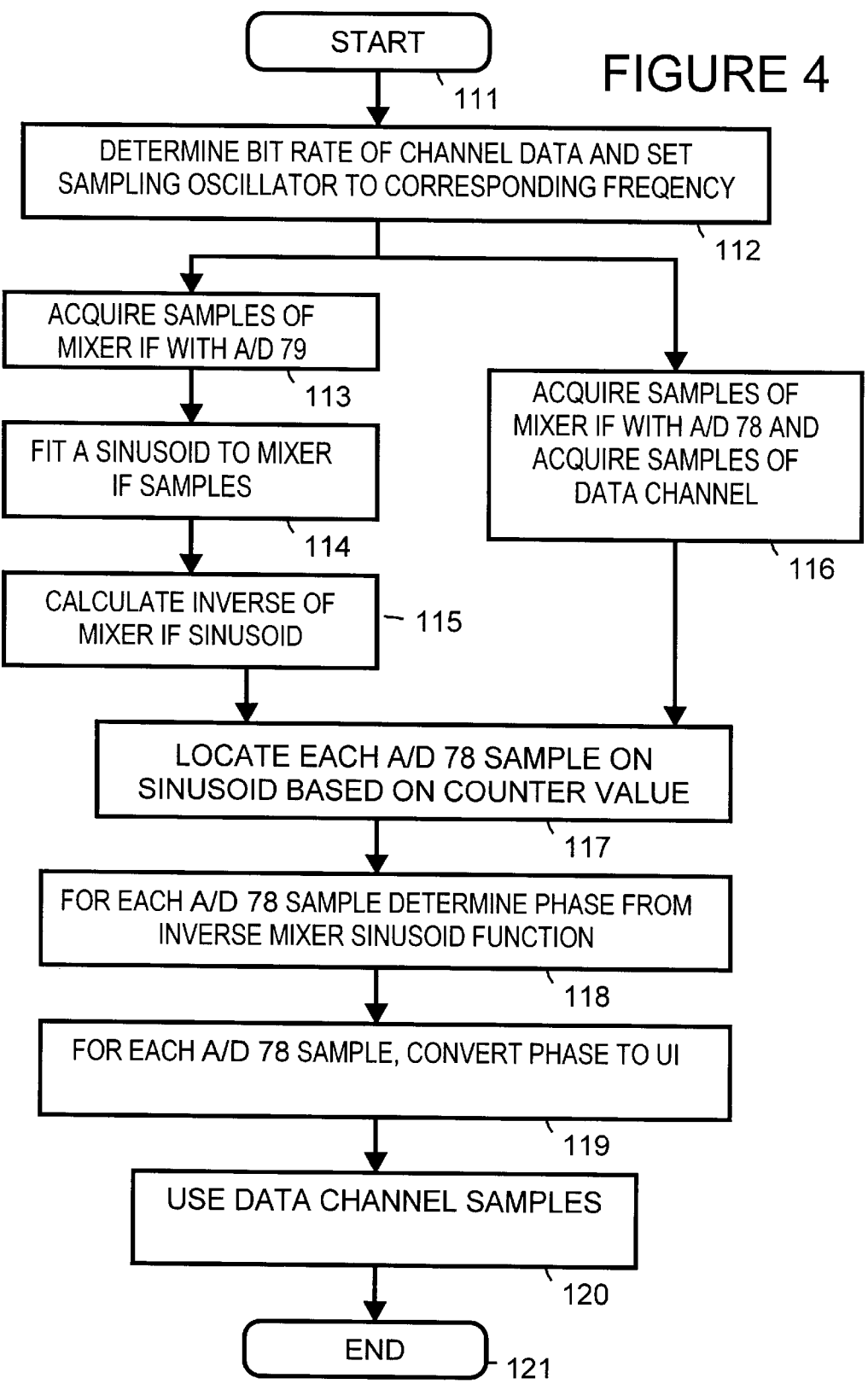
FIG. 4 is a flowchart that describes determination of timing data from information obtained by the sampling circuitry shown in FIG. 3 in accordance with an alternative preferred embodiment of the present invention.

FIG. 4 is a flowchart that describes determination of timing data from information obtained and stored by A/D converter 73, A/D converter 83, A/D converter 78, A/D converter 79 and memory 87. The process starts in a block 111.

In a block 112, the bit rate of the sample channel is determined and sampling oscillator 88 is set to the corresponding frequency. For example, the user indicates the nominal data rate is 9.95324 Gb/s as defined by the SONET OC-192 standard. Alternatively, for example, for sample channel signal 71 and sample channel signal 81, the bit rate can be determined by the frequency of operation of clock reference 74.

In a block 113, A/D converter 79 captures mixer channel voltage values ($a_0, a_1, a_2, \ldots a_N$) at a sample rate determined by the output of oscillator 85. At each cycle of oscillator 85, digital counter 86 is incremented.

In a block 114, a sinusoid waveform is fitted to the mixer channel voltage values ($a_0, a_1, a_2, \ldots a_N$) captured by A/D converter 79.

In a block 115, an inverse of the sinusoidal waveform is calculated.

In a block 116, samples of the mixer channel are also taken simultaneously with samples of the data channels. For example, A/D converter 73 captures sampled data channel voltage values of ($S_0, S_1, S_2, \ldots S_N$). Simultaneously. A/D converter 78 captures mixer channel voltage values of $b_0, b_1, b_2, \ldots b_N$. The counter value is also captured in memory 87.

In a block 117, for each of the mixer channel voltage values ($b_0, b_1, b_2, \ldots b_N$) captured by A/D converter 78, the recorded counter value is used to locate the data sample on the sinusoid waveform fitted in block 114.

In a block 118, for each of the mixer channel voltage values ($b_0, b_1, b_2, \ldots b_N$) captured by A/D converter 78, a phase is determined from the inverse of the sinusoidal waveform, calculated in block 115.

In a step 119, for each of the mixer channel voltage values ($b_0, b_1, b_2, \ldots b_N$) captured by A/D converter 78, the phase calculated in block 116 is converted to a bit period interval (UI).

In a block 118, the data samples are used to represent the sampled data.

The sampled data may be displayed. For example, when displaying each data sample, the vertical component is determined by the sampled data channel voltage values and the horizontal component is determined by the bit period unit interval.

The sampled data also can be used for additional measurements and/or manipulations to provide further information about the sample channel signal.

In a block 121, the process is completed.

In FIG. 1, the timebase circuitry consists of sampling oscillator 35, frequency divider 36, mixer 26, LPF 27 and A/D converter 28. The time base circuitry can be expanded when it is desired to add references in addition and asynchronous to clock reference 24.

Figure 5:
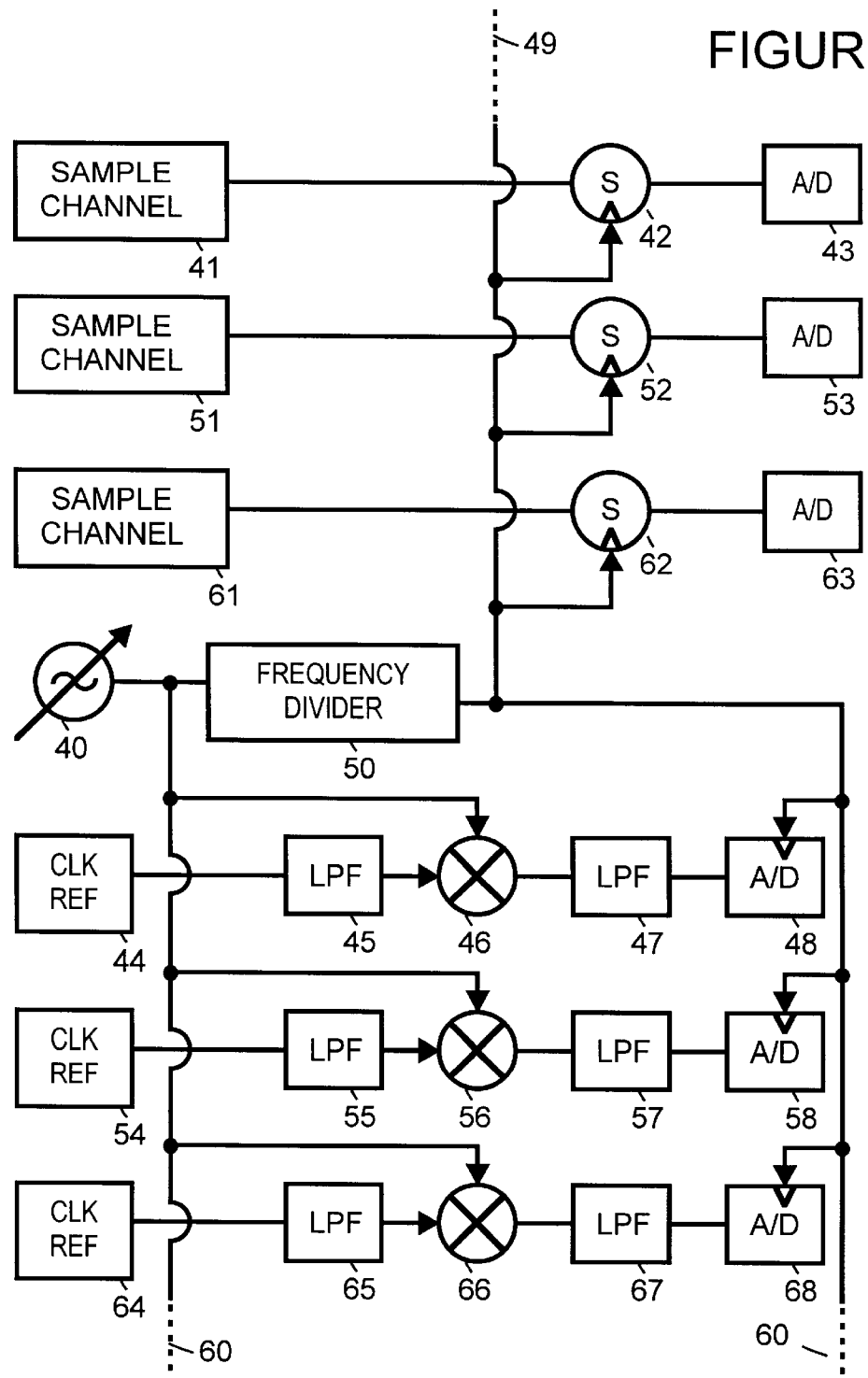
FIG. 5 is a simplified block diagram of sampling circuitry within an electronic device in accordance with another alternative preferred embodiment of the present invention.

For example, FIG. 5 shows timebase circuitry that can be used for multiple channels operating asynchronously to one another.

In FIG. 5, a sampler (S) 42 samples a sample channel signal 41. An A/D converter 43 generates a digital value representing the analog voltage of the sample channel signal 41 at each sampling time. These digital values are stored for use in signal display and analysis. For example, sampler 42 is implemented by a fast switch and a storage component. In some embodiments, Sampler 42 also can include a step recover diode (SRD) to generate a short sample aperture. A/D converter 43 includes for example, amplification and filtering capability to accurately capture and convert the signals.

A sampler (S) 52, samples a sample channel signal 51. An A/D converter 53 generates a digital value representing the analog voltage of the sample channel signal 51 at each sampling time. These digital values are stored for use in signal display and analysis.

A sampler (S) 62 samples a sample channel signal 61. An A/D converter 63 generates a digital value representing the analog voltage of the sample channel signal 61 at each sampling time. These digital values are stored for use in signal display and analysis.

A sampling oscillator 40 generates a high frequency signal that is frequency divided by a frequency divider 50 in order to produce a sampling signal used to control timing of samples by sampler 42, sampler 52, sampler 62, A/D converter 48, A/D converter 58 and A/D converter 68. For example, frequency divider 50 is implemented by a phase locked loop, a counter or some other circuitry that accomplishes division of signal frequency. Provided sampler 42, sampler 52, sampler 62, A/D converter 48, A/D converter 58 and A/D converter 68 are able to operate within the frequency range of sampling oscillator 40, frequency divider 50 can be omitted.

While FIG. 5 shows only sample channel signal 41, sample channel signal 51, sample channel signal 61, and corresponding timebase portions, as represented by a line 49, and lines 60, frequency divider 50 can supply the sampling signal to additional samplers and corresponding timebase portions facilitating the sampling of additional asynchronous sample channel signals.

A clock reference 44 is synchronous with sample channel signal 41. A low pass filter (LPF) 45 is used to remove any noise and/or harmonics within clock reference 44. Low pass filter 45 can be implemented in hardware. Alternatively, the function of low pass filter 45 can be implemented in the software used to process information gathered about clock reference 44. Provided clock reference 44 is a sufficiently clean sinusoid, low pass filter 45 may be omitted.

An RF mixer 46 performs a mix operation between the high frequency signal generated by sampling oscillator 40 and clock reference 44 producing an intermediate frequency (IF) that is the sum and difference of frequencies input to mixer 46. A low pass filter (LPF) 47 removes the sum component of the mixed signal, leaving the difference component of the mixed signal. The difference component of the mixed signal indicates the frequency difference between clock reference 44 and the high frequency signal generated by sampling oscillator 40. Mixer 46 and LPF 47 together function as a phase comparator. While in the frequency domain, the output of the phase comparator is the frequency difference between clock reference 44 and the high frequency signal generated by sampling oscillator 40, in the time domain, the output of the phase comparator is the instantaneous phase difference between clock reference 44 and the high frequency signal generated by sampling oscillator 40.

An A/D converter 48 generates digital values indicating the phase difference at each time sample channel signal 41 is sampled. When the phase difference between clock reference 44 and the high frequency signal generated by sampling oscillator 40 is small, the difference component of the mixed signal will be low frequency, allowing A/D converter 48 and any other following processing circuitry to operate at low frequency. Low frequency operation allows for a significant cost savings in components.

A clock reference 54 is synchronous with sample channel signal 51. A low pass filter (LPF) 55 is used to remove any noise and/or harmonics within clock reference 54. An RF mixer 56 performs a mix operation between the high frequency signal generated by sampling oscillator 40 and clock reference 54. A low pass filter (LPF) 57 removes the sum component of the mixed signal, leaving the difference component of the mixed signal. An A/D converter 58 generates digital values indicating the phase difference at each time sample channel signal 51 is sampled.

A clock reference 64 is synchronous with sample channel signal 61. A low pass filter (LPF) 65 is used to remove any noise and/or harmonics within clock reference 64. An RF mixer 66 performs a mix operation between the high frequency signal generated by sampling oscillator 40 and clock reference 64. A low pass filter (LPF) 67 removes the sum component of the mixed signal, leaving the difference component of the mixed signal. An A/D converter 68 generates digital values indicating the phase difference at each time sample channel signal 61 is sampled.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A sampling system that performs sampling, the sampling system comprising:
    a sampler that takes samples of a sampled signal;
    a first analog-to-digital (A/D) converter that receives the samples from the sampler;
    a clock reference synchronous with the sampled signal;
    an oscillating signal;
    a phase comparator that produces a difference value that indicates a phase difference between the clock reference and the oscillating signal; and,
    a second A/D converter that receives the difference value;
    wherein the oscillating signal is used in controlling when the sampler takes samples of the sampled signal.

2. A sampling system as in claim 1 additionally comprising:
    a second sampler that takes second samples of a second sampled signal; and,
    a third A/D converter that receives the second samples from the second sampler;
    wherein the clock reference is also synchronous with the second sampled signal.

3. A sampling system as in claim 1 additionally comprising a frequency divider that frequency divides the oscillating signal to produce a divided signal, the divided signal being used to control when the sampler takes samples of the sampled signal and when the second A/D converter accepts the difference value.

4. A sampling system as in claim 3 wherein the frequency divider is implemented using a phase locked loop.

5. A sampling system as in claim 3 wherein the frequency divider is implemented using a counter.

6. A sampling system as in claim 3 additionally comprising:
    a third A/D converter that receives the difference value;
    a counter;
    a memory that receives a current value from the counter; and,
    a second oscillating signal used to control timing of counting by the counter and to control when the third A/D converter accepts the difference value;
    wherein the divided signal is also used to control when the memory receives the current value.

7. A sampling system as in claim 3 additionally comprising:
    a second sampler that takes second samples of a second sampled signal;
    a third A/D converter that receives the second samples from the second sampler;
    a second clock reference synchronous with the second sampled signal;
    a second phase comparator that produces a second difference value that indicates a phase difference between the second clock reference and the oscillating signal; and,
    a fourth A/D converter that receives the second difference value;
    wherein the divided signal is also used to control when the fourth A/D converter accepts the second difference value.

8. A sampling system as in claim 7 additionally comprising:
    a third sampler that takes third samples of a third sampled signal;
    a fifth A/D converter that receives the third samples from the third sampler;
    a third clock reference synchronous with the third sampled signal;
    a third phase comparator that produces a third difference value that indicates a phase difference between the third clock reference and the oscillating signal; and,
    a sixth A/D converter that receives the third difference value;
    wherein the divided signal is also used to control when the sixth A/D converter accepts the third difference value.

9. A sampling system as in claim 1 where the phase comparator comprises
    a mixer that mixes the clock reference and the oscillating signal to produce a mixed signal; and,
    a filter that filters the mixed signal to produce the difference value that indicates the phase difference between the clock reference and the oscillating signal.

10. A sampling system as in claim 1 additionally comprising a processing unit that uses data to perform digital display and analysis.

11. A sampling system as in claim 1 wherein the second A/D converter obtains instantaneous phase difference at each time the sampler takes a sample of the sampled signal.

12. A sampling system as in claim 1 wherein the sampling system additionally includes a filter that filters the clock reference before the clock reference is received by the phase comparator.

13. A sampling system as in claim 1 wherein the oscillating signal is used in controlling when the second A/D converter accepts the difference value.

14. A method for performing sampling, the method comprising the following steps:
    (a) sampling a sampled signal at a rated based on an oscillating signal, including the following substep:
        (a.1) performing analog-to-digital conversion on each sampled value of the sampled signal;
    (b) performing a phase comparison between a clock reference and the oscillating signal to produce a difference value that indicates a phase difference between the clock reference and the oscillating signal, wherein the clock reference is synchronous to the sampled signal; and,
    (c) performing analog-to-digital conversion of the difference value.

15. A method as in claim 14 additionally comprising the following step:
    (d) frequency dividing the oscillating signal to produce a divided signal;
    wherein in step (a) the sampled signal is sampled at a frequency determined by the divided signal; and,
    wherein in step (c) analog-to-digital conversion of the difference value is performed at the frequency determined by the divided signal.

16. A method as in claim 15 additionally comprising the following step:
    (e) sampling a second sampled signal at a frequency determined by the divided signal, including the following substep:
        (e.1) performing analog-to-digital conversion on each sampled value of the second sampled signal;
    wherein the clock reference is also synchronous with the second sampled signal.

17. A method as in claim 15 additionally comprising the following steps:

(e) performing analog-to-digital conversion of the difference value at a frequency determined by a second oscillating signal;
(f) performing counting at a frequency determined by the second oscillating signal; and,
(g) storing, in a memory, counts at a frequency determined by the divided signal.

18. A method as in claim 15 additionally comprising the following steps:
(e) sampling a second sampled signal at a frequency determined by the divided signal, including the following substep:
  (e,1) performing analog-to-digital conversion on each sampled value of the second sampled signal;
(f) performing phase comparison between a second clock reference and the oscillating signal to produce a second difference value that indicates a phase difference between the second clock reference and the oscillating signal; and,
(g) performing analog-to-digital conversion of the second difference value at a frequency determined by the divided signal.

19. A method as in claim 18 additionally comprising the following steps:
(h) sampling a third sampled signal at a frequency determined by the divided signal, including the following substep:
  (h.1) performing analog-to-digital conversion on each sampled value of the third sampled signal;
(i) performing a phase comparison between a third clock reference and the oscillating signal to produce a third difference value that indicates a phase difference between the third clock reference and the oscillating signal; and,
(j) performing analog-to-digital conversion of the third difference value at a frequency determined by the divided signal.

20. A method as in claim 14 wherein step (b) includes the following substeps:
mixing the clock reference and the oscillating signal to produce a mixed signal, the clock reference being synchronous with the sampled signal; and,
filtering the mixed signal to produce a difference value that indicates the frequency difference between the clock reference and the oscillating signal.

21. A sampling system that performs sampling, the sampling system comprising:
an oscillating signal;
sampler means for taking samples of a sampled signal based on the oscillating signal;
first analog-to-digital (A/D) converter means for receiving the samples from the sampler means;
a clock reference synchronous with the sampled signal;
phase comparator means for performing a phase comparison between the clock reference and the oscillating signal to determine a phase difference between the clock reference and the oscillating signal; and,
second A/D converter means for receiving the difference value.

22. A sampling system as in claim 21 additionally comprising:
frequency divider means for frequency dividing the oscillating signal to produce a divided signal, the divided signal being used to control when the sampler means takes samples of the sampled signal and when the second A/D converter means accepts the difference value.

* * * * *